United States Patent
Lan et al.

(10) Patent No.: US 11,585,458 B2
(45) Date of Patent: Feb. 21, 2023

(54) ELECTRONIC EXPANSION VALVE

(71) Applicant: Zhejiang Sanhua Intelligent Controls Co., Ltd., Shaoxing (CN)

(72) Inventors: Yaofeng Lan, Zhejiang (CN); Yingchong Lu, Zhejiang (CN); Rongrong Zhang, Zhejiang (CN)

(73) Assignee: Zhejiang Sanhua Intelligent Controls Co., Ltd., Shaoxing (CN)

( * ) Notice: Subject to any disclaimer, the term of this patent is extended or adjusted under 35 U.S.C. 154(b) by 103 days.

(21) Appl. No.: 16/648,648

(22) PCT Filed: Mar. 30, 2018

(86) PCT No.: PCT/CN2018/081274
§ 371 (c)(1),
(2) Date: Mar. 18, 2020

(87) PCT Pub. No.: WO2019/062057
PCT Pub. Date: Apr. 4, 2019

(65) Prior Publication Data
US 2020/0232690 A1    Jul. 23, 2020

(30) Foreign Application Priority Data

Sep. 27, 2017    (CN) .......................... 201710889387.4

(51) Int. Cl.
F16K 31/04    (2006.01)
F25B 41/35    (2021.01)
(52) U.S. Cl.
CPC ............ F16K 31/046 (2013.01); F25B 41/35 (2021.01); *F25B 2341/068* (2013.01)
(58) Field of Classification Search
CPC .. F16K 31/06; F25B 2341/068; F25B 41/345; F25B 41/35; F25B 41/31
See application file for complete search history.

(56) References Cited

U.S. PATENT DOCUMENTS 5,323,075 A * 6/1994 Denk .................. H02K 3/47
310/68 B
6,225,716 B1    5/2001 Sies et al.
(Continued)

FOREIGN PATENT DOCUMENTS

CN    2155519 Y    2/1994
CN    1268804 A    10/2000
(Continued)

OTHER PUBLICATIONS

New Devices for Optoelectronics Smart Pixels, Fiber Optic Data Communication: Technological Trends and Advances, Shoop (Year: 2002).*

(Continued)

*Primary Examiner* — Schyler S Sanks
(74) *Attorney, Agent, or Firm* — Wolf, Greenfield & Sacks, P.C.

(57) ABSTRACT

An electronic expansion valve including a rotor, a stator and a circuit board the rotor includes a permanent magnet, and the permanent magnet includes at least two pairs of magnetic poles; the stator includes a coil and a bobbin, wherein the coil is supported by the bobbin, and the bobbin is disposed at the periphery of the permanent magnet. Also included is a Hall sensor, which is disposed on the periphery of the permanent magnet; the Hall sensor and the coil are electrically connected to the circuit board; the Hall sensor includes a sensing portion, and the sensing portion is used for sensing magnetic pole change of the permanent magnet; the sensing portion is always located between the two ends of the permanent magnet during the entire operating process of the rotor.

8 Claims, 9 Drawing Sheets

(56) References Cited

U.S. PATENT DOCUMENTS

| | | | |
|---|---|---|---|
| 6,366,194 B1* | 4/2002 | Riehl | G01D 11/245 338/221 |
| 6,460,567 B1 | 10/2002 | Hansen, III et al. | |
| 6,501,270 B1 | 12/2002 | Opie | |
| 7,385,394 B2* | 6/2008 | Auburger | G01P 3/488 324/207.25 |
| 9,599,363 B1 | 3/2017 | Smith et al. | |
| 2002/0050915 A1 | 5/2002 | Reihl et al. | |
| 2004/0003603 A1 | 1/2004 | Saeki et al. | |
| 2014/0353391 A1* | 12/2014 | Burklin | F25B 41/31 236/92 B |
| 2016/0146366 A1* | 5/2016 | Takahashi | F16K 3/00 251/129.15 |

FOREIGN PATENT DOCUMENTS

| | | |
|---|---|---|
| CN | 101858725 A | 10/2010 |
| CN | 204300408 U | 4/2015 |
| DE | 19748982 A1 | 6/1999 |
| EP | 1 160 887 A2 | 12/2001 |
| EP | 3 502 531 A1 | 6/2019 |
| ES | 1 077 252 U | 6/2012 |
| JP | H03-186675 A | 8/1991 |
| JP | 2001-508241 A | 6/2001 |
| JP | 2003-329698 A | 11/2003 |
| JP | 2006-109666 A | 4/2006 |
| JP | 2010-078002 A | 4/2010 |
| JP | 2010-124519 A | 6/2010 |
| JP | 2010-124520 A | 6/2010 |
| JP | 2016-220403 A | 12/2016 |
| KR | 2001-0105743 A | 11/2001 |

OTHER PUBLICATIONS

International Search Report and Written Opinion for International Application No. PCT/CN2018/081274, dated Jun. 29, 2018.
PCT/CN2018/081274, Jun. 29, 2018, International Search Report and Written Opinion.
JP2020-517313, Apr. 20, 2021, Office Action.
Office Action for Japanese Application No. 2020-517313, dated Apr. 20, 2021.
Extended European Search Report for European Application No. 18863657.5, dated May 19, 2021.

* cited by examiner

ELECTRONIC EXPANSION VALVE

This application is a national stage filing under 35 U.S.C. § 371 of International Patent Application Serial No. PCT/CN2018/081274, filed Mar. 30, 2018, which claims priority to Chinese patent application No. 201710889387.4, titled "ELECTRONIC EXPANSION VALVE", filed with the China National Intellectual Property Administration on Sep. 27, 2017. The contents of these applications are incorporated herein by reference in their entirety.

FIELD

The present disclosure relates to flow control devices, and in particular to an electric flow control device.

BACKGROUND

An electronic expansion valve includes a stepping motor. The stepping motor is controlled to rotate by a controller, and rotor locking may occur in the stepping motor due to existence of an obstacle during rotation of the stepping motor. In order to detect whether the stepping motor is operating normally, the electronic expansion valve needs to be detected with a detecting element. How to ensure the stability of the detecting element is an urgent problem to be solved.

SUMMARY

One object of the present disclosure is to provide an electronic expansion valve which has a simple structure and can detect the operating state of the electronic expansion valve.

In order to achieve the above object, the following technical solution is provided. An electronic expansion valve includes a rotor, a stator, and a circuit board. The rotor includes a permanent magnet, the permanent magnet includes at least two pairs of magnetic poles, the stator includes a coil and a coil bobbin, the coil is supported by the coil bobbin and is electrically connected to the circuit board, and the coil bobbin is arranged around the permanent magnet. The electronic expansion valve further includes a Hall sensor, and the Hall sensor is arranged at a periphery of the permanent magnet and is electrically connected to the circuit board. The Hall sensor comprises a sensing portion and a connecting portion, and the sensing portion is electrically connected to the circuit board through the connecting portion and is configured to sense a magnetic pole change of the permanent magnet. The sensing portion is always located in a corresponding radial region between two axial ends of the permanent magnet during an entire operation process of the rotor; or in a case that the rotor is located at a bottom dead center, at least part of a projection of the sensing portion in an axial direction of the rotor overlaps with at least part of a projection of the permanent magnet in the axial direction of the rotor. The electronic expansion valve further comprises a box body, part of the box body is formed through injection molding by using the stator as an insert, a box cavity is formed in the box body, and the circuit board and the Hall sensor are both arranged in the box cavity. The electronic expansion valve comprises a mounting portion, the sensing portion is fixedly connected to the mounting portion, and the mounting portion is arranged between the Hall sensor and the circuit board or the mounting portion is a part of the Hall sensor.

The electronic expansion valve detects the magnetic pole change of the permanent magnet through the Hall sensor provided at the periphery of the rotor assembly, that is, the detecting element is the Hall sensor. The Hall sensor includes a sensing portion and a connecting portion, the electronic expansion valve includes a mounting portion, and the sensing portion is fixedly connected to the mounting portion, where the mounting portion is arranged between the Hall sensor and the circuit board or the mounting portion is a part of the Hall sensor, thereby achieving a fixed connection to the detecting element and facilitating improving the stability of a detection signal.

DETAILED DESCRIPTION

The present disclosure will be further described hereinafter in conjunction with the drawings and some specific embodiments.

Figure 1:
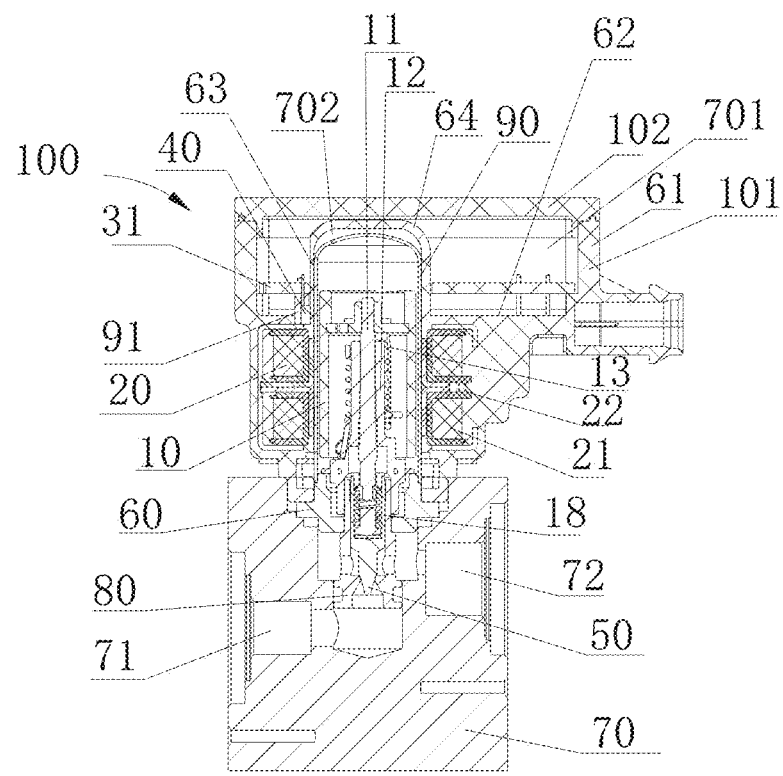
FIG. 1 is a schematic view showing the structure of an electronic expansion valve according to a first embodiment.
Figure 2:
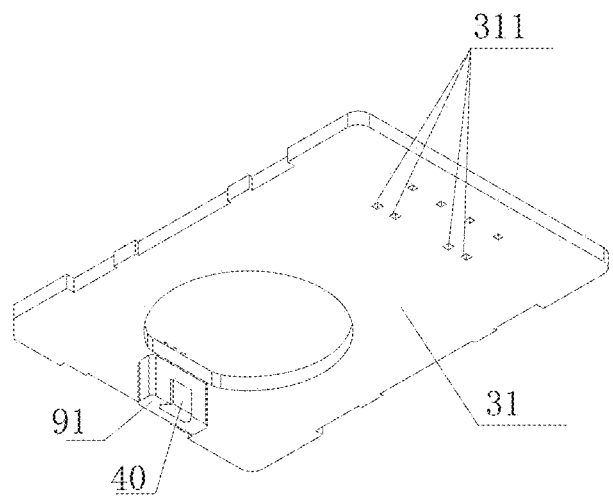
FIG. 2 is a schematic view showing the structure of a combination of the circuit board, the Hall holder, and the Hall sensor in FIG. 1 from one perspective.
Figure 3:
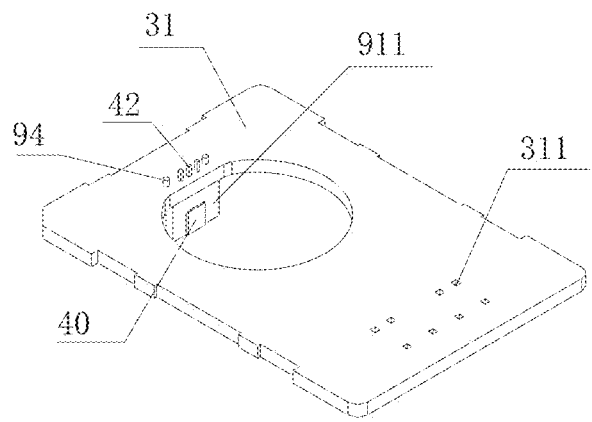
FIG. 3 is a schematic view showing the structure of the combination of the circuit board, the Hall holder, and the Hall sensor in FIG. 1 from another perspective.
Figure 4:
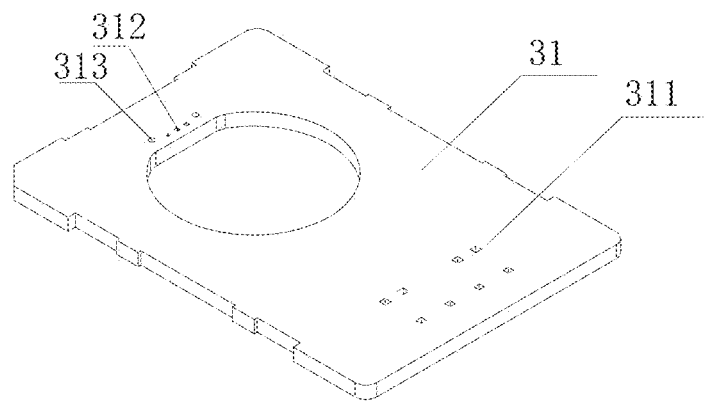
FIG. 4 is a schematic view showing the structure of the circuit board in FIG. 3.
Figure 5:
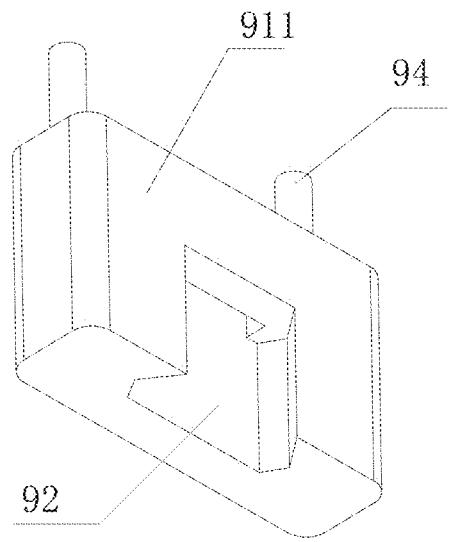
FIG. 5 is a schematic view showing the structure of the Hall holder in FIG. 2 from one perspective.
Figure 6:
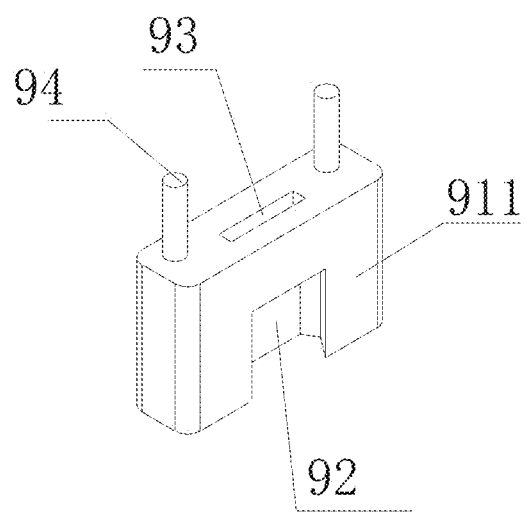
FIG. 6 is a schematic view showing the structure of the Hall holder in FIG. 2 from another perspective.
Figure 7:
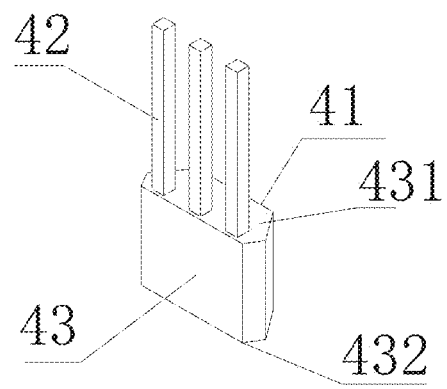
FIG. 7 is a schematic view showing the structure of the Hall sensor in FIG. 2.
Figure 8:
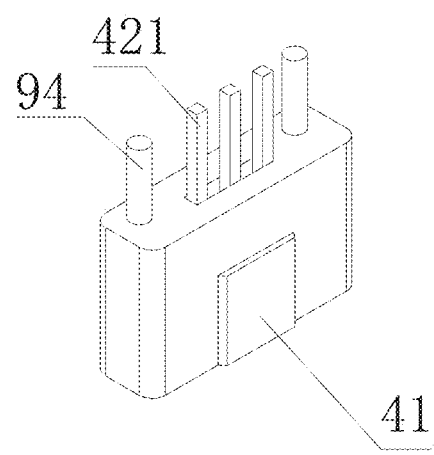
FIG. 8 is a schematic view showing the structure of a combination of the Hall holder and the Hall sensor in FIG. 2.
Figure 9:
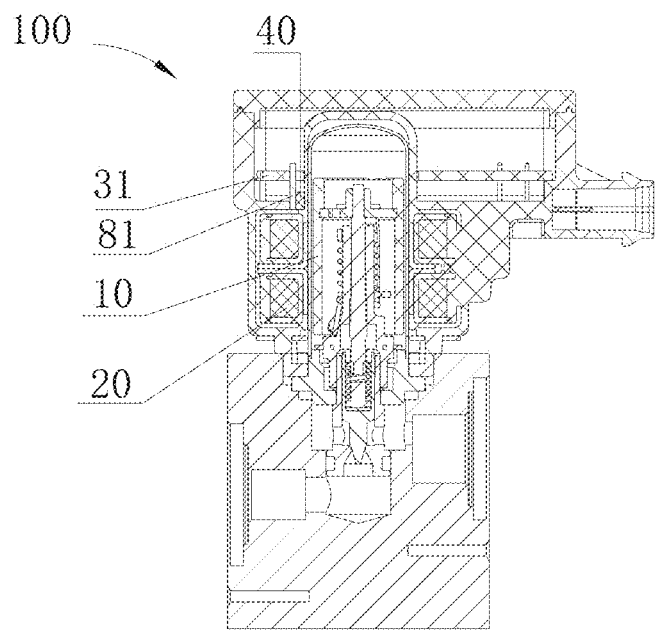
FIG. 9 is a schematic view showing the structure of an electronic expansion valve according to a second embodiment.
Figure 10:
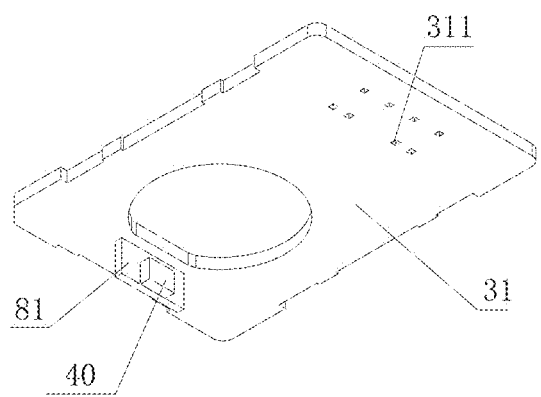
FIG. 10 is a schematic view showing the structure of a combination of the circuit board, the adapter plate, and the Hall sensor in FIG. 9 from one perspective.
Figure 11:
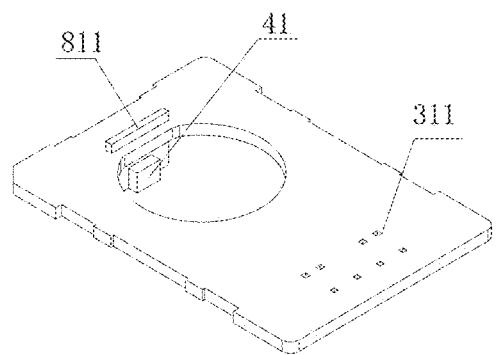
FIG. 11 is a schematic view showing the structure of the combination of the circuit board, the adapter plate, and the Hall sensor in FIG. 9 from another perspective.
Figure 12:
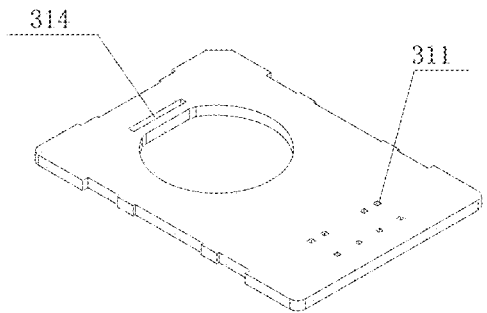
FIG. 12 is a schematic view showing the structure of the circuit board in FIG. 11.
Figure 13:
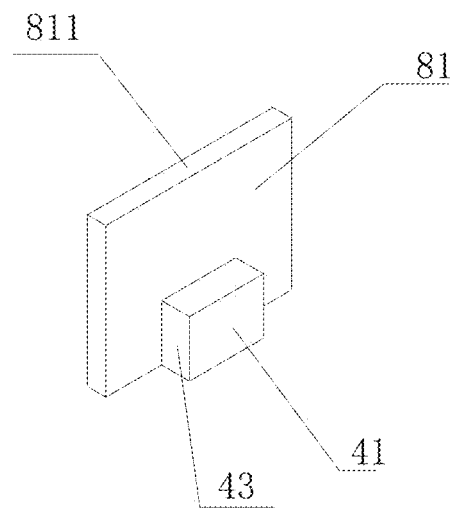
FIG. 13 is a schematic view showing the structure of a combination of the adapter plate and the Hall sensor in FIG. 10.
Figure 14:
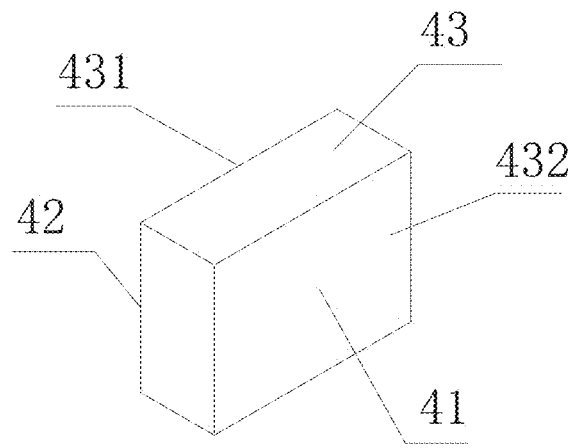
FIG. 14 is a schematic view showing the structure of the Hall sensor in FIG. 13.
Figure 15:
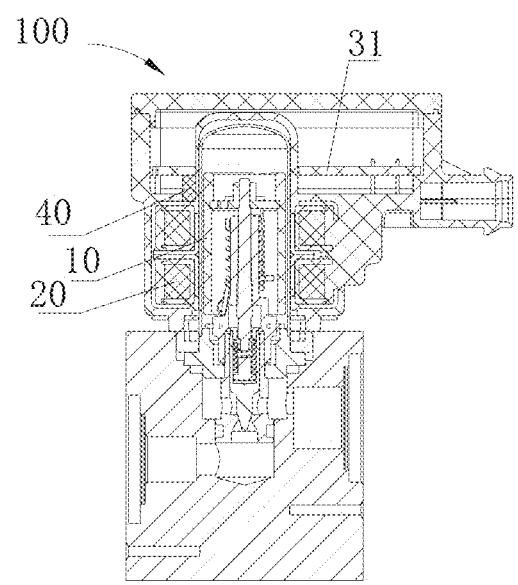
FIG. 15 is a schematic view showing the structure of an electronic expansion valve according to a third embodiment.

Referring to FIGS. 1, 9 and 15, an electronic expansion valve 100 includes a rotor 10 and a stator 20, the stator 20 is arranged around the rotor 10, the rotor 10 includes a permanent magnet, the permanent magnet includes at least two pairs of magnetic poles, and the stator 20 includes a coil 21 and a coil bobbin 22. The coil bobbin 22 provides support for the coil 21, and the coil 21 is energized by a current that changes according to a certain law, thereby forming an excited magnetic field at an inner circumference of the stator 20. The magnetic field of the permanent magnet of the rotor 10 interacts with the excited magnetic field of the stator 20, and the rotor 10 is rotatable about a central axis.

The electronic expansion valve 100 further includes a controller and a Hall sensor 40. The Hall sensor 40 is configured to sense a magnetic pole change of the rotor 10 and form a feedback signal, and may be a position sensor, and the feedback signal includes a Hall signal. The controller includes a circuit board 31 and a processor (not shown), and the processor is fixed to the circuit board 31. The processor is configured to send a control signal to the stator 20 based on a collected feedback signal. A power supply supplies power to the stator 20 and the controller. The controller may be a part of the electronic expansion valve or may be placed in a system to which the electronic expansion valve is applied, such as an air conditioning system or a higher-level automotive controller, and by providing a driver for receiving the control signal and converting the control signal into a drive signal in the electronic expansion valve, the object of the present disclosure is achieved. This embodiment will be described with the controller being a part of the electronic expansion valve.

The electronic expansion valve 100 further includes a valve needle 50, a valve seat 60, a valve body 70, and a valve port member 80. A valve port is formed by the valve port member 80, and a first channel 71 and a second channel 72 are formed in the valve body. The first channel 71 and the second channel 72 are arranged at two sides of the valve port, and the valve needle 50 is driven to rotate by the rotor 10. Specifically, the valve needle 50 and the rotor 10 moves between a top dead center and a bottom dead center, and in a case that the valve needle 50 is at the bottom dead center, the valve port is closed, and the first channel 71 and the second channel 72 on two sides of the valve port are cut off; as the valve needle 50 moves from the bottom dead center to the top dead center, the valve port is gradually opened, the channels on two sides are communicated with each other through the valve port, and after the valve needle 50 reaches the top dead center, the opening of the valve port is maximized. In this embodiment, a valve port is formed in the valve port member 80, the valve port member 80 is fixedly connected to the valve body 70, the valve seat 60 is fixedly connected to the valve body 70, and the valve needle 50 is connected to the rotor 10. In practice, the valve port may also be formed in the valve body 70, in which case the valve port member 80 is not required. In the embodiment, the valve port member 80 and the valve body 70 may be individually provided and separately formed, which is beneficial for reducing a process difficulty of a mold and improving processing precision of the valve port.

Referring to FIG. 1, the electronic expansion valve 100 further includes a lead screw 11, a nut member 12, and a stopper portion 13. The nut member 12 is sleeved around the lead screw 11, and the nut member 12 and the lead screw 11 are fitted with each other by means of screw thread. The nut member 12 is fixedly arranged relative to the valve seat 60, the lead screw 11 is movable upward or downward relative to the nut member 12, and the stopper portion 13 and the lead screw 11 are fixedly connected to each other through a connecting plate. The stopper portion 13 moves upward or downward relative to the nut member 12, and the movement of the lead screw 11 is limited between the top dead center and the bottom dead center by cooperation of the stopper portion with the nut member 12. Since the valve needle 50 can drive the lead screw 11 to move, the movement of the valve needle 50 is limited within the distance between the top dead center and the bottom dead center. An elastic member 18 is provided between the valve needle 50 and the lead screw 11, so that when the valve needle 50 is moved to the bottom dead center, the valve needle 50 and the valve port member 80 elastically contact with each other, providing a buffer between the valve needle 50 and the valve port member 80, and thereby facilitating improving the service life of the valve needle 50 and the valve port member 80.

The electronic expansion valve 100 further includes a sleeve 90 which isolates the stator 20 and the rotor 10 from each other. The sleeve 90 is in fixed and sealed connection with the valve seat 60 and is a metal piece. To ensure that the movement of the valve needle 50 is not interfered, a length of the sleeve 90 is larger than a sum of a length of the rotor 10 and a running distance of the valve needle 50.

Figure 18:
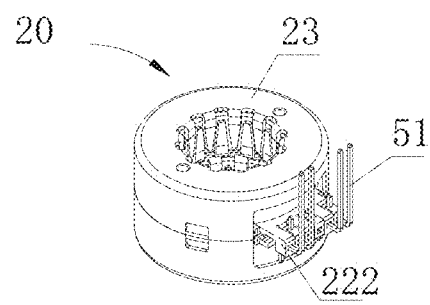
FIG. 18 is a schematic view showing the structure of a stator assembly according to the above embodiments.
Figure 19:
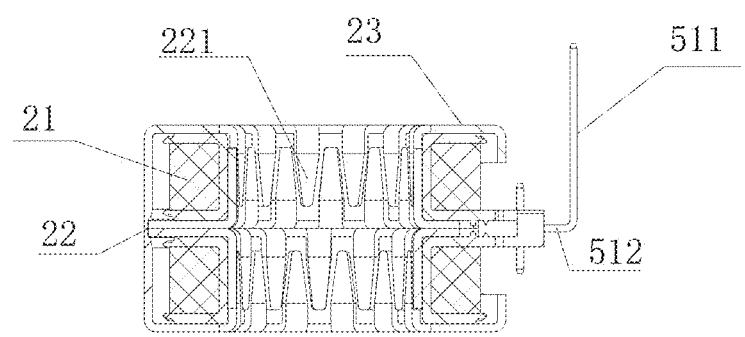
FIG. 19 is a schematic cross-sectional view of the stator assembly in FIG. 18.

Referring to FIGS. 18 and 19, the stator 20 includes a coil 21, a coil bobbin 22, and a stator housing 23, and further includes a stator pole plate 221. The stator pole plate 221 is provided with a claw pole for generating an alternating magnetic field, and the stator housing 23 covers an outer circumference of the coil bobbin 22 and the coil 21.

The electronic expansion valve 100 further includes a first pin 51. The first pin 51 is integrally formed, and is fixedly connected to the stator 20. The first pin 51 electrically connects the circuit board 40 to the stator 20. The first pin 51 includes a first portion 511 and a second portion 512, the first portion 511 is electrically connected to the circuit board 31, and the second portion 512 is electrically connected to the stator 20. The coil bobbin 22 includes a fixing portion 222, the second portion 512 and the fixing portion 222 are connected to each other by transition fit or clearance fit, the second portion 512 is fixed to the coil by welding, and the first portion 511 and the second portion 512 presents a L-like shape. Such a configuration makes it easier to form the pin, in which the first pin 51 is first fixedly connected to the stator 20, an end of the coil 21 is electrically connected to the second portion 512 and then the first pin 51 is bent by 90 degrees to connect to the circuit board 31.

The circuit board 31 has elements fixed thereon, and the circuit board 31 is placed as close as possible to the stator 20 without hindering the elements, which is beneficial for reducing a length of the first portion 511, thereby facilitating the connection reliability of the first pin 51. A pin hole 311 is formed in the circuit board 31, and the first portion 511 of the first pin 51 is electrically connected to the circuit board 31 through the pin hole 311.

The electronic expansion valve 100 further includes an injection molding portion formed by using the stator 20 as an insert. The injection molding portion includes a first side wall 61 and a first bottom 62, a first cavity 701 is enclosed by the first side wall 61 and the first bottom 62, and the first cavity 701 and the stator 2 are arranged along an axial direction of the electronic expansion valve. The injection molding portion 60 includes a second side wall 63 and a second bottom 64, and a second cavity 702 is enclosed by the second side wall 63 and the second bottom and is arranged in communication with an inner cavity of the stator 20. The circuit board 31 and the Hall sensor 40 are arranged in the first cavity 701, and the first cavity 701 is not in communication with the second cavity 702. In this embodiment, the second side wall 63 and second bottom 64 are a part of the first bottom 62.

Referring to FIGS. 1, 9, and 15, in the axial direction of the electronic expansion valve 100, the Hall sensor 40 is arranged between the circuit board 31 and the stator 20; in a radial direction of the electronic expansion valve 100, the Hall sensor 40 is arranged at the periphery of the rotor 10 and is placed as close as possible to the rotor 10; the rotor 10 and the stator 20 are isolated from each other by the sleeve 90, and thicknesses of the sleeve 90 and the second side wall 63 are as small as possible under the condition strength thereof is guaranteed, which is beneficial for magnetic transfer.

The rotor 10 includes at least two pairs of magnetic poles, each pair of magnetic poles includes an N pole and an S pole, and N poles and S poles are alternately arranged in a circumferential direction of the rotor. In this embodiment, the electronic expansion valve employs a two-phase stepping motor with twelve pairs of poles, and the rotor 10 includes twelve N poles and twelve S poles. The Hall sensor 40 is located at the periphery of the rotor 10 and close to the rotor 10. When the rotor 10 rotates, the N poles and S poles of the rotor 10 alternately pass by the Hall sensor 40, the Hall sensor 40 generates a periodic feedback signal, and the feedback signal is a square wave signal. The controller collects the feedback signal and determines an operating state of the electronic expansion valve by a state of the feedback signal, where the operating state of the electronic expansion valve includes normal operation and rotor locking.

The Hall sensor 40 includes a sensing portion 41. A sensing surface of the sensing portion 41 of the Hall sensor 40 is tightly arranged against an outer circumference of the second side wall 63, to ensure the sensitivity of the Hall sensor 40. The length of the rotor 10 is larger than a sum of a length of the coil bobbin and a length of the sensing portion of the Hall sensor 40; or during the entire operation process of the rotor, the sensing portion is always located in a corresponding radial region between two axial ends of the permanent magnet; when the rotor is at the bottom dead center, at least part of a projection of the sensing portion in the axial direction of the rotor overlaps with at least part of a projection of the permanent magnet in the axial direction of the rotor; or the sensing portion 41 is always located between two ends of the permanent magnet during the entire operation process of the rotor, which is beneficial for ensuring the detecting accuracy of the Hall sensor 40.

FIGS. 1 to 8 are schematic views of an electronic expansion valve according to a first embodiment. The electronic expansion valve 100 further includes a box body 101, and a box cavity is formed in the box body 101. The box body 101 includes a first side wall 61 and a first bottom 62. The circuit board 31 and the Hall sensor 40 are both arranged in the box cavity. The electronic expansion valve 100 further includes a box cover 102. In this embodiment, the box cavity is the first cavity 701. In practice, the box cavity may be larger than the first cavity 701, for example, an inner cavity may be formed by the cover 102 and the box cavity may include the first cavity and the inner cavity.

In this embodiment, as shown in FIGS. 2 to 8, the Hall sensor 40 includes a sensing portion 41, a connecting portion 42, and a package portion 43. The connecting portion 42 includes a second pin 421, and the package portion 43 is formed through injection molding by using the sensing portion 41 and the second pin 421 as an insert. The package portion 43 includes a first end 431 and a second end 432. The connecting portion 42 is connected to the first end 432, the sensing portion 41 is arranged between the first end 431 and the second end 432, and the connecting portion 42 is electrically connected to the circuit board 31 and fixed to the circuit board 31 by welding. Specifically, a first connecting hole 312 is formed in the circuit board 31, and the connecting portion 42 is arranged to pass through the first connecting hole 312 and fixed to the circuit board 31 by welding. The sensing portion 41 is fixedly arranged with respect to the circuit board 31 through the package portion 43.

In this embodiment, the mounting portion is a holder 91. The holder 91 includes a holder body 911, a first engagement portion, and a second engagement portion. The Hall sensor 40 is plugged into the first engagement portion, and at least part of the second engagement portion and part of the circuit board 31 are engaged with each other by interference fit.

In this embodiment, the first engagement portion includes a mounting groove 92 and a through hole 93 that are formed in the holder body 911. The package portion 43 is accommodated in the mounting groove 92, and is tightly fitted against a side wall of the holder body 11 in which the mounting groove 92 is formed. The second pin 421 is connected to the circuit board 31 after passing through the through hole 93. The circuit board 31 is provided with a first connecting hole 312, and the second pin 421 is fixed to and electrically connected to the circuit board 31 by welding after passing through the first connecting hole 312. The second engagement portion includes a connecting post 94 formed at an end of the holder body 911. The connecting post 94 and the holder body 911 are integrally through injection molding. A second connecting hole 313 corresponding to the connecting post is formed in the circuit board, and the connecting post 94 is plugged into the second connecting hole 313 and is connected with the circuit board 31 by interference fit. In order to ensure the connection reliability, a length of the second pin 421 is larger than or equal to a length of the connecting post 94, and in this way, a distance between the Hall sensor 40 and the circuit board 31 is limited by the lengths of the second pin 421 and the connecting post 94 in this embodiment.

In this embodiment, in assembling the electronic expansion valve, the holder 91 and the Hall sensor 40 are first assembled to form an assembly, and then the assembly is assembled with the circuit board 31. The connecting portion of the Hall sensor 40 is the second pin 421, and the second pin 421 provides electrical connection between the Hall sensor 40 and the circuit board 31. The package portion 43 and the sensing portion 41 are fixedly connected to the circuit board 31 through the holder 91, and the Hall sensor 31 is fixedly connected to the holder 91. The holder 91 is made of plastic, and strength of the holder 91 is higher than strength of the second pin 421 to maintain the position of the Hall sensor 40 relative to the circuit board 31, which is beneficial for improving the connection strength between the Hall sensor 40 and the circuit board 31, especially in a case that an operating environment of the electronic expansion valve is an air conditioning system of a vehicle where vibration generated during running of the vehicle transmitted to the electronic expansion valve causes position changes of a sensing surface of the Hall sensor and results in instable feedback signals. In this embodiment, the Hall sensor and the circuit board are engaged with each other by the holder and the circuit board is fixed to the box body, which is beneficial for improving the connection stability of the Hall sensor.

FIGS. 9 to 14 are schematic views of an electronic expansion valve according to a second embodiment, which mainly differs from the first embodiment in that the mounting portion is an adapter plate 81. The Hall sensor 40 includes a sensing portion 41, a connecting portion 42 and a package portion 43. The package portion 43 includes a first end 431 and a second end 432. The first end 432 and the second end 433 are arranged opposite to each other. The sensing portion 41 is formed at the second end 432, and the connecting portion 42 is a lead formed at the first end. The adapter plate 81 is provided with a bonding pad, and the Hall sensor 40 is electrically connected to the bonding pad of the adapter plate 81 through the lead, where a length by which the lead protrudes from the first end 431 is smaller than a length by which the second pin 421 protrudes from the first end 431 in the first embodiment. The distance between the Hall sensor 40 and the circuit board 31 is limited by the adapter plate 81. A length of the Hall sensor can be shortened, which is beneficial for miniaturizing the Hall sensor 40 and simplifying the assembly process of the electronic expansion valve. The adapter plate 81 is plugged into the circuit board 31, where the adapter plate 81 is provided with a plug 811 and the circuit board 31 is provided with a socket 314. The adapter plate 81 and the circuit board 31 may also be fixedly connected to each other by welding, where a first bonding pad is formed on the circuit board, a second bonding pad is formed at an end of the adapter plate and the first bonding pad and the second bonding pad are fixed to and electrically connected to each other by welding, which is beneficial for improving the connection strength between the adapter plate 81 and the circuit board 31. A connecting circuit of the Hall sensor 40 can be provided on the adapter plate 81 to facilitate saving the layout space of the circuit board 31.

Figure 16:
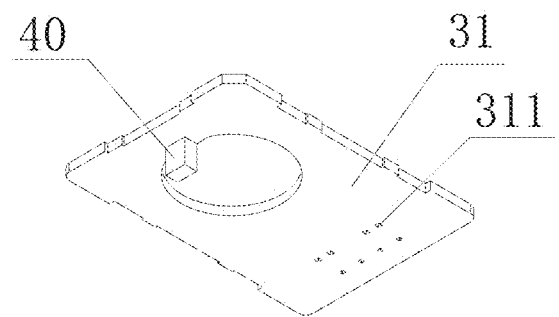
FIG. 16 is a schematic view showing the structure of a combination of the circuit board and the Hall sensor in FIG. 15 from one perspective.
Figure 17:
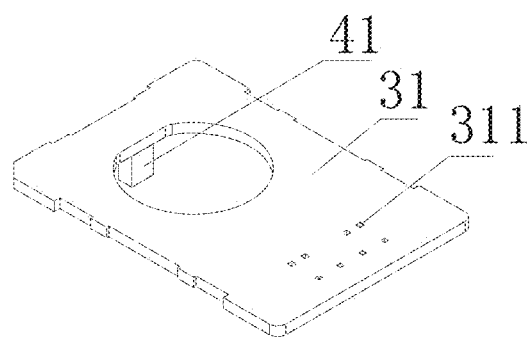
FIG. 17 is a schematic view showing the structure of the combination of the circuit board and the Hall sensor in FIG. 15 from another perspective.

FIGS. 15 to 17 are schematic views of an electronic expansion valve according to a third embodiment, which mainly differs from the first embodiment in the following. In conjunction with FIG. 14, the Hall sensor 40 includes a sensing portion 41, a connecting portion 42 and a package portion 43. The package portion 43 is fixed to the sensing portion 41 through injection molding. The package portion 43 includes a first end 431 and a second end 432. The connecting portion 42 is a lead formed at the first end, a bonding pad is formed on the circuit board 31, and the lead is fixed to the bonding pad by welding. Since the connecting portion 42 is a lead, a length of the connecting portion 42 is short, which is beneficial for improving the connection stability between the Hall sensor and the circuit board. Besides, in order to ensure that the sensing portion 41 is located between top and bottom end surfaces of the permanent magnet and to guarantee the connection of the Hall sensor 40 to the circuit board 31, the length and strength of the Hall sensor 40 are increased by the package portion 43, thereby improving the connection stability of the Hall sensor. The electronic expansion valve according to this embodiment has a simpler structure than that according to the first embodiment and the second embodiment.

It should be noted that the above embodiments are only used to explain the present disclosure and are not intended to limit the technical solutions described in the present disclosure. Although the present disclosure has been described in detail with reference to the embodiments described above, a person of ordinary skill in the art shall appreciate that modifications or equivalents may be made to the present disclosure by those skilled in the art, and that all the technical solutions and improvements thereof not departing from the spirit and scope of the disclosure shall be covered by the claims according to the present disclosure.

The invention claimed is:

1. An electronic expansion valve, comprising:
a rotor, a stator, and a circuit board, the rotor comprising a permanent magnet, the permanent magnet comprising at least two pairs of magnetic poles, the stator comprising a coil and a coil bobbin, the coil being supported by the coil bobbin and electrically connected to the circuit board, and the coil bobbin being arranged around the permanent magnet,
wherein the electronic expansion valve further comprises a Hall sensor, the Hall sensor is arranged at a periphery of the permanent magnet and is electrically connected to the circuit board, the Hall sensor comprises a sensing portion and a connecting portion, the sensing portion is electrically connected to the circuit board through the connecting portion, and the sensing portion is configured to sense a magnetic pole change of the permanent magnet;
the sensing portion is always located in a corresponding radial region between two axial ends of the permanent magnet during an entire operation process of the rotor;
the electronic expansion valve further comprises a box body, part of the box body is formed through injection molding by using the stator as an insert, a box cavity is formed in the box body, and the circuit board and the Hall sensor are both arranged in the box cavity;
the electronic expansion valve comprises a mounting portion, the sensing portion is fixedly connected to the mounting portion, and the mounting portion is arranged between the Hall sensor and the circuit board,
wherein the mounting portion comprises an adapter plate, the adapter plate is provided with a connecting circuit, the Hall sensor is fixed to and electrically connected to the adapter plate, and the adapter plate is fixed to and electrically connected to the circuit board.

2. The electronic expansion valve according to claim 1, wherein the Hall sensor comprises a package portion, the package portion encapsulates the sensing portion, the connecting portion comprises a lead, the lead protrudes from the package portion, the lead and the sensing portion are arranged opposite to each other, the adapter plate comprises a bonding pad, and the lead is fixedly connected to the bonding pad.

3. The electronic expansion valve according to claim 2, wherein the circuit board is provided with a socket, the adapter plate comprises a plug, and the adapter plate is fixed to and electrically connected to the circuit board by plugging the plug into the socket.

4. The electronic expansion valve according to claim 2, wherein a first bonding pad is formed on the circuit board, a second boding pad is formed at an end of the adapter plate, and the first bonding pad and the second bonding pad are fixed to and electrically connected to each other by welding.

5. An electronic expansion valve, comprising:
a rotor, a stator, and a circuit board, the rotor comprising a permanent magnet, the permanent magnet comprising at least two pairs of magnetic poles, the stator comprising a coil and a coil bobbin, the coil being supported by the coil bobbin and electrically connected to the circuit board, and the coil bobbin being arranged around the permanent magnet,
wherein the electronic expansion valve further comprises a Hall sensor, the Hall sensor is arranged at a periphery of the permanent magnet and is electrically connected to the circuit board, the Hall sensor comprises a sensing portion and a connecting portion, the sensing portion is electrically connected to the circuit board through the connecting portion, and the sensing portion is configured to sense a magnetic pole change of the permanent magnet;

the sensing portion is always located in a corresponding radial region between two axial ends of the permanent magnet during an entire operation process of the rotor;

the electronic expansion valve further comprises a box body, part of the box body is formed through injection molding by using the stator as an insert, a box cavity is formed in the box body, and the circuit board and the Hall sensor are both arranged in the box cavity;

the electronic expansion valve comprises a mounting portion, the sensing portion is fixedly connected to the mounting portion, the mounting portion is arranged between the Hall sensor and the circuit board, and the mounting portion is a part of the Hall sensor, wherein the mounting portion comprises an adapter plate, the adapter plate is provided with a connecting circuit, the Hall sensor is fixed to and electrically connected to the adapter plate, and the adapter plate is fixed to and electrically connected to the circuit board.

6. The electronic expansion valve according to claim 5, wherein the Hall sensor comprises a package portion, the package portion encapsulates the sensing portion, the connecting portion comprises a lead, the lead protrudes from the package portion, the lead and the sensing portion are arranged opposite to each other, the adapter plate comprises a bonding pad, and the lead is fixedly connected to the bonding pad.

7. The electronic expansion valve according to claim 6, wherein the circuit board is provided with a socket, the adapter plate comprises a plug, and the adapter plate is fixed to and electrically connected to the circuit board by plugging the plug into the socket.

8. The electronic expansion valve according to claim 6, wherein a first bonding pad is formed on the circuit board, a second boding pad is formed at an end of the adapter plate, and the first bonding pad and the second bonding pad are fixed to and electrically connected to each other by welding.

* * * * *